United States Patent
Tsironis

(10) Patent No.: US 10,281,510 B1
(45) Date of Patent: May 7, 2019

(54) LOAD PULL METHOD FOR TRANSISTORS DRIVEN BY MODULATED SIGNAL

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 204 days.

(21) Appl. No.: 15/479,569

(22) Filed: Apr. 5, 2017

(51) Int. Cl.
*G01R 23/02* (2006.01)
*G01R 31/26* (2014.01)

(52) U.S. Cl.
CPC .......... *G01R 23/02* (2013.01); *G01R 31/2607* (2013.01)

(58) Field of Classification Search
CPC . G01R 31/2607; G01R 27/2605; G01R 17/00
See application file for complete search history.

(56) References Cited

U.S. PATENT DOCUMENTS

| | | | | |
|---|---|---|---|---|
| 6,566,944 B1 * | 5/2003 | Pehlke | ................. | H03F 1/0233 330/10 |
| 7,135,941 B1 | 11/2006 | Tsironis | | |
| 7,646,267 B1 | 1/2010 | Tsironis | | |
| 9,252,738 B1 | 2/2016 | Tsironis | | |
| 9,257,963 B1 | 2/2016 | Tsironis | | |
| 9,310,410 B1 | 4/2016 | Tsironis | | |
| 2003/0227330 A1 * | 12/2003 | Khanifar | ............... | H03F 1/0261 330/302 |
| 2009/0011732 A1 * | 1/2009 | Bayruns | .................. | H03D 7/18 455/150.1 |

OTHER PUBLICATIONS

M.J.Pelk et al: "Base-Band Impedance Control and Calibration for On-Wafer Linearity Measurements", ARFTG 2004, pp. 35-40.
"Adjacent Channel Power Ratio (ACPR)", application note, Anritsu Corporation, [online], Feb. 28, 2001 [received Jul. 22, 2008], <URL: https://www.anritsu.com/search/en-US/default?q=application+note+acpr+ME7840A&spell=1&access=p&output=xml_no_dtd&client=us_www2&num=20&site=us_www_root_prod&ie=UTF-8&sort=date:D:L:d1>.
"Error Vector Magnitude (EVM)" [online], [retrieved on Jul. 22, 2008] <URL: http:/ /en.wikipedia.org/wiki/Error_vector_magnitude>.
"Intermodulation (IMD)" [online], [retrieved on Jul. 22, 2008] <URl:http://en.wikipedia.org/wiki/Intermodulation>.

* cited by examiner

Primary Examiner — Jermele M Hollington
Assistant Examiner — Alvaro E Fortich

(57) ABSTRACT

A test method allows investigating the dependence of microwave gain, power and linearity behavior of transistors, in which modulated RF signal is injected, as a function of source and load impedance at the signal RF carrier frequency and its harmonics as well as at the modulation (baseband) IF frequency using passive programmable tuners. A calibration method allows synthesizing independently impedances at the various frequencies without the need of on-line vector signal measurement. The test setup performs independent impedance tuning at RF and IF frequencies of the modulated signal at the input and output of the DUT. This allows optimizing IF impedances for nonlinear amplifier performance with modulated signal, such as ACPR, EVM etc. IF tuning is done using a low frequency programmable impedance tuner inserted in the DC branch of the bias networks, which act as frequency diplexers.

6 Claims, 9 Drawing Sheets

LOAD PULL METHOD FOR TRANSISTORS DRIVEN BY MODULATED SIGNAL

PRIORITY CLAIM

Not Applicable

CROSS-REFERENCE TO RELATED ARTICLES

1. U.S. Pat. No. 9,252,738, Tsironis, "Wideband tuning probes for impedance tuners and method", FIG. 3.
2. U.S. Pat. No. 9,310,410, Tsironis, "Load and source pull test system for RF and baseband frequencies", FIG. 5.
3. U.S. Pat. No. 7,646,267, Tsironis, "Low Frequency Electro-mechanical Impedance Tuner"
4. U.S. Pat. No. 9,252,738, Tsironis, "Wideband tuning probes for impedance tuners and method", FIG. 2
5. U.S. Pat. No. 7,135,941, Tsironis, "Triple probe automatic slide screw load pull tuner and method", FIGS. 9 and 10.
6. U.S. Pat. No. 7,646,267, Tsironis, "Low Frequency Electro-mechanical impedance tuner", FIG. 5.
7. M. J. Pelk et al: "Base-Band Impedance Control and Calibration for On-Wafer Linearity Measurements", ARFTG 2004, pp. 35-40.
8. U.S. Pat. No. 9,257,963, Tsironis, "Impedance tuners with rotating probes", Claim 2, FIG. 14.
9. U.S. Pat. No. 7,135,941, Tsironis, "Triple probe automatic slide screw load pull tuner and method", FIG. 24, Claim 6.
10. "Adjacent Channel Power Ratio (ACPR)", application note, Anritsu Corporation, [online], Feb. 28, 2001 [received Jul. 22, 2008], <URL: https://www.anritsu.com/search/en-US/default?q=application+note+acpr+ME7840A&spell=1&access=p&output=xml_no_dtd&client=us_www2&num=20&site=us_www_root_prod&ie=U-TF-8&sort=date:D:L:d1>.
11. "Error Vector Magnitude (EVM)" [online], [retrieved on Jul. 22, 2008] <URL: http://en.wikipedia.org/wiki/Error_vector_magnitude>.
12. "Intermodulation (IMD)" [online], [retrieved on Jul. 22, 2008] <URL:http://en.wikipedia.org/wiki/Intermodulation>.

BACKGROUND OF THE INVENTION

This invention relates to a new method of testing of RF transistors in nonlinear operation using automatic RF and low frequency (IF) impedance tuners. The tuners create user defined test impedances and optimize the transistor (DUT) performance at the signal RF (Carrier) and at low modulation (IF) frequency simultaneously and totally independently.

Modern design of RF high power microwave amplifiers, mixers and other components used in various communication systems requires accurate knowledge of the characteristics of the transistors used in the circuits. It is insufficient and inaccurate for the transistors operating at high power in their highly non-linear regions, to be described using analytical or numerical models. Instead the transistors (DUT) need to be characterized using specialized test setups, which use tuners and other test equipment, under the actual operating conditions.

A traditional method for testing and characterizing transistors for high power operation is "load pull" and "source pull" (FIG. 1). Load pull or source pull are measurement techniques employing signal sources, RF impedance tuners (input and output), discrete DUT's in test fixtures or chips on-wafer and other test equipment, like a Power Meter. A control computer recalls previously generated tuner calibration data, positions the tuner's tuning probes to create the desired impedances and reads instrument data via GPIB or other digital communication.

Electro-mechanical microwave slide-screw tuners (see ref. 1) are used in most cases for high power load pull testing, because they have several advantages, such as long-term stability, higher handling of RF power, easier operation and lower cost, compared to other type of tuners such as electronic and active tuners. A benefit of slide screw tuners favoring in particular this kind of combined RF-IF tuning operation, is their low pass behavior, meaning that at low (IF) frequencies these tuners behave like simple 50Ω through transmission lines.

In most cases of wireless communication the RF signal is not pure carrier wave (CW) but includes some kind of modulation, which contains the information to be transmitted. In these cases the signal spectrum spreads around the main carrier wave (RF) and the bandwidth depends on the information contained and the modulation techniques used. Modern telecommunication schemes require sidebands of several MHz up to a few dozens of MHz (FIG. 2). The transistors being driven into the nonlinear regime, the RF upper and lower sideband frequencies (USB+LSB) are mixed down into the IF baseband and from there they interact with the (low frequency) DC biasing circuitry $Z_{IF}$ (FIG. 3) and from there they get mixed up again into the RF signal where they interact with the original modulation signals (FIG. 4). This phenomenon is instantaneous and must be investigated by simultaneous RF and IF impedance control. In the context of available technology RF here means frequencies in the GHz range (0.8 to 18 GHz typically) and IF means the low MHz range (1 to 20 MHz, typically). But the method is valid globally for any two distinct frequency bands.

This invention describes a method, which allows controlling and optimizing not only, as hereto, the RF impedances seen by the DUT in the GHz frequency range, but also, at the same time, the low frequency impedances, at baseband IF frequency in the MHz range; the IF impedances are presented to the DUT essentially through the DC biasing networks which act as frequency diplexers (separators between RF and IF frequencies). Typical LC bias networks, also called Bias Tees, are shown in FIG. 5 (53) and FIG. 8.

BRIEF SUMMARY OF THE INVENTION

The test setup used for the method is shown in FIG. 5 (see ref. 2). It comprises single probe (wideband) and/or multi-probe (harmonic) RF slide screw tuners (see ref. 4 and 5) connected to the input and output ports of the DUT and IF (low frequency, baseband) Line-Capacitor based tuners (see ref. 6) inserted into the DC path of the bias networks. The RF tuners reflect the RF frequencies and ignore the IF frequencies, whereby the low frequency tuners reflect the IF frequencies and block (ignore, do not affect) the RF frequencies. In that sense both tuner types control impedances independently at two distinct and remote frequency bands ($F_{IF}$<20 MHz, $F_{RF}$>1 GHz). The tuners are calibrated and operate simultaneously and independently allowing investigating the DUT environment for optimum tuning conditions both at RF and IF frequencies.

Investigating the effect of low frequency (IF, baseband) frequency components cannot be done using RF tuners only, which, due to their low pass behavior, do not operate in baseband IF frequency; neither can low frequency (LC based) tuners be cascaded in the same path with the RF tuners, simply because, having low-pass behavior, they would cut-off the signal flow from the RF signal source to the DUT. The baseband frequency components generated by the transistor flow through the DC branch of the bias-tee (52) and "see" the impedance of the IF (LC-based) tuner (57), see ref. 3, whereas the main RF signal flows through the capacitor (54) or the RF branch of the bias-tee and "sees" the RF tuner (50), (51). Thus, the DUT "sees" two independently controllable sets of impedances: one set at RF (such as 2, 4, 8 GHz etc.) and another set at baseband frequency (such as 1, 2 . . . 20 MHz). This allows testing, investigating and mapping the combined effect of those impedances on the RF behavior of the DUT simultaneously and independently.

DESCRIPTION OF PRIOR ART

In a single case of prior art known the baseband impedance is controlled using active signal injection after down-converting from the modulated RF signal using simultaneous on-line vector receiver measurement (see ref. 7). However, in this invention only passive tuners are used, which allow pre-calibration and independent synthesis of any user defined RF or Baseband impedance without plugged-in vector receivers and the associated systematic investigation of the DUT behavior under such conditions.

BRIEF DESCRIPTION OF THE DRAWINGS

The invention and its mode of operation will be better understood from the following detailed description when read with the appended drawings in which.

DETAILED DESCRIPTION OF THE INVENTION

Figure 5:
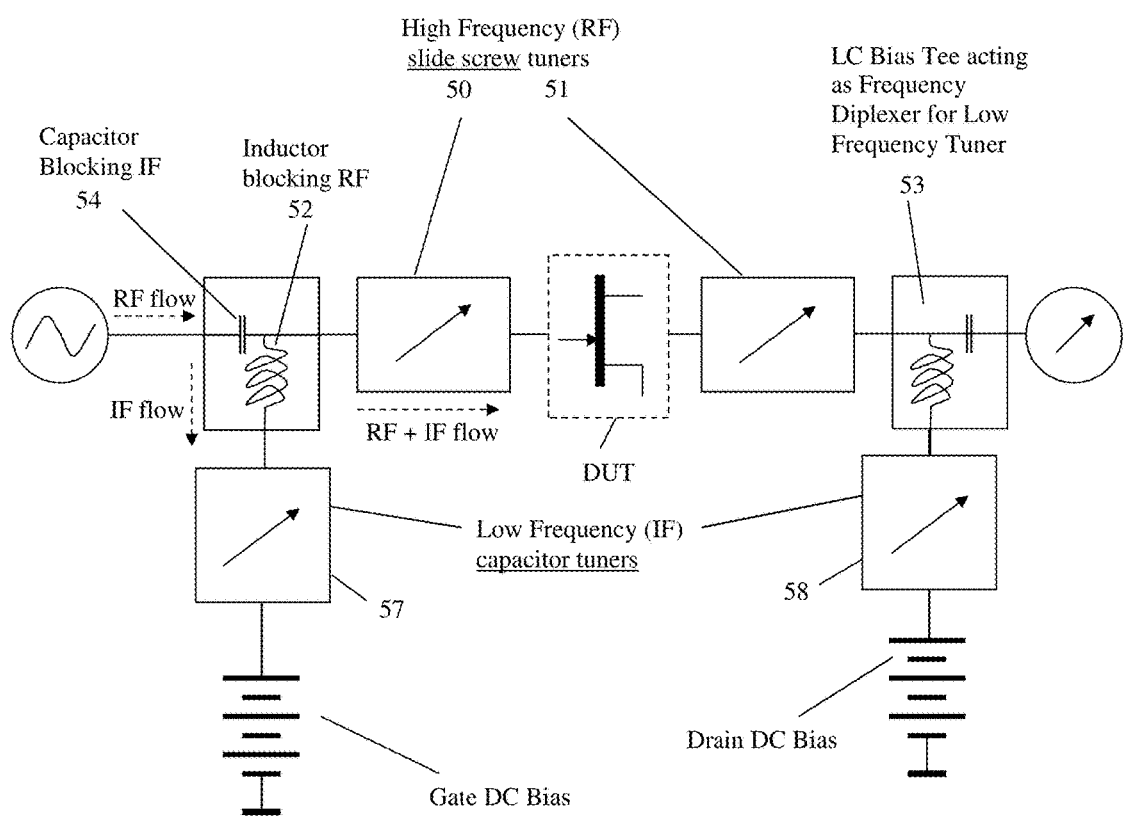
FIG. 5 depicts load pull setup using LC bias tee and low frequency (IF) tuners to control the IF impedance at the DUT ports.

The test setup uses DC Bias-Tees as a frequency Diplexer (52), (53) (or DC from RF signal separator), FIG. 5. The bias-tee allows RF frequencies to pass-through from the signal source to the DUT at very low insertion loss. A blocking chip capacitor (54) of adequate size (1 to a few Pico-Farad (pF)) inserted in the signal path is an appropriate and commonly used solution. The DC path is blocked for the RF signal by an inductor (52).

Figure 2:
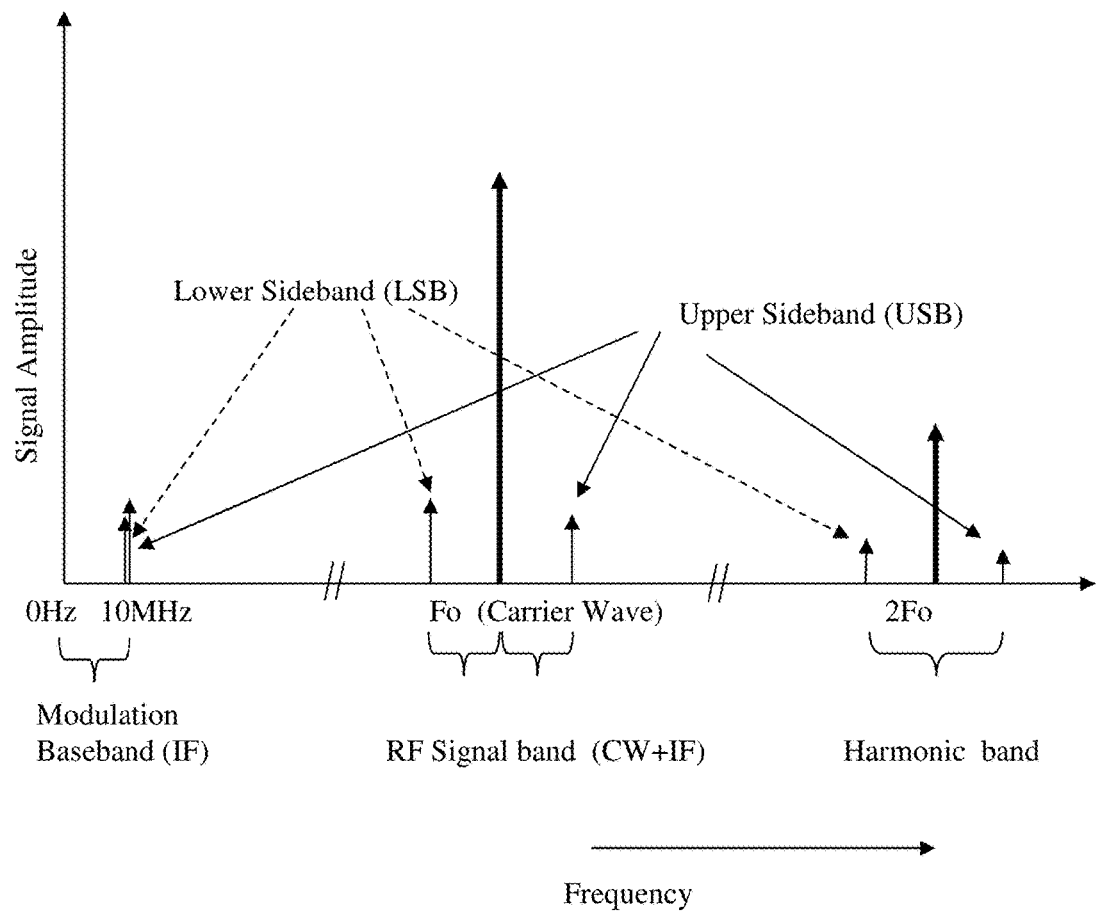
FIG. 2 depicts prior art, signal components in the frequency domain of modulated signal amplified and down-converted by a nonlinear DUT; non-proportional frequency scale and frequency examples are used for demonstration purposes.
Figure 3:
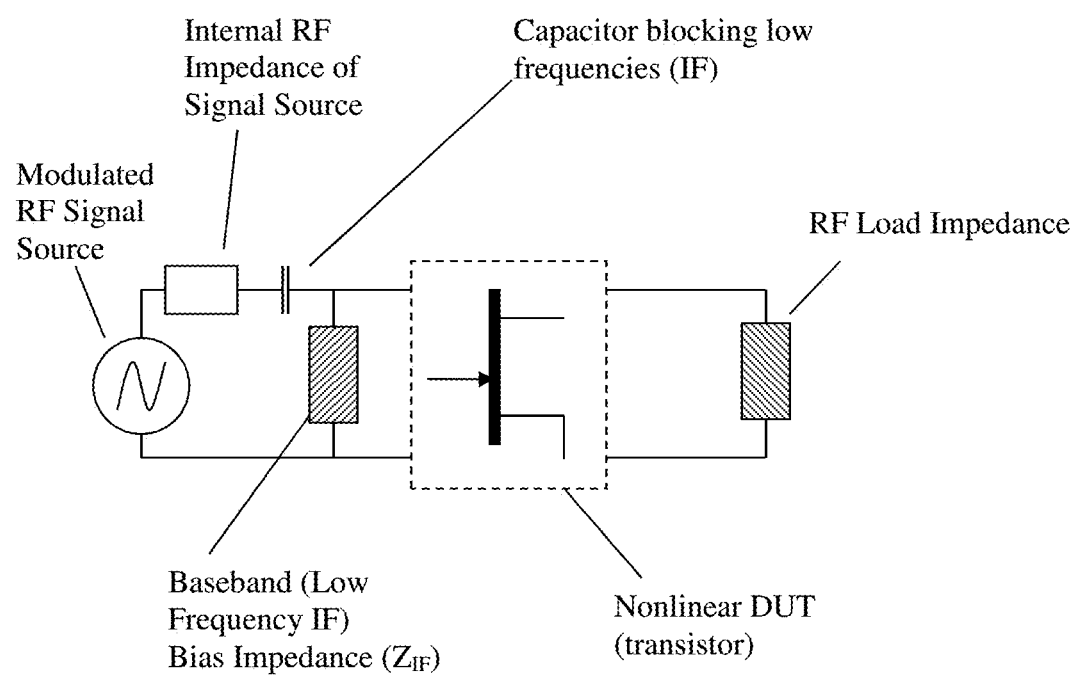
FIG. 3 depicts prior art, RF and IF impedances presented to the DUT.
Figure 4:
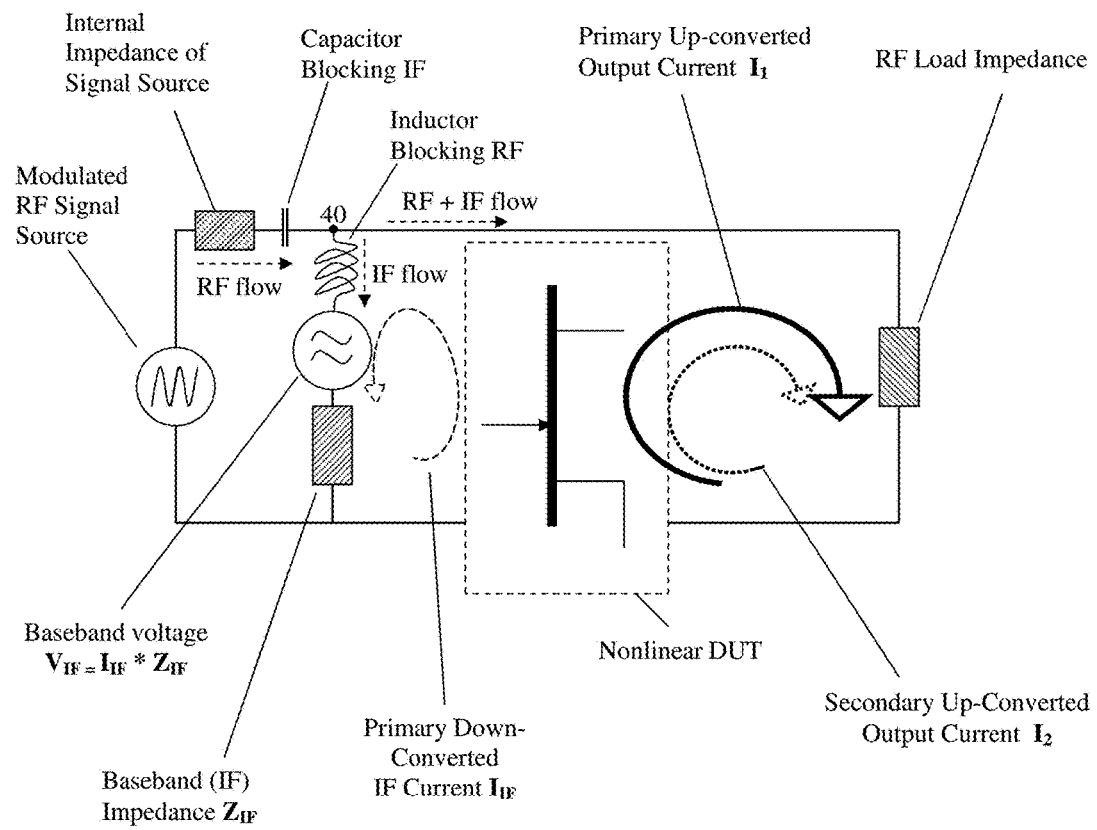
FIG. 4 depicts down- and up-conversion mechanism in nonlinear DUT.

The sideband signals at the output of the nonlinear DUT (FIGS. 2 to 4) create, through the DUT frequency conversion mechanism, caused by its non-linearities, a primary down-converted signal (current) $I_{IF}$ at the IF baseband frequency at the input side of the DUT (FIG. 4). This low-frequency current does not pass through to the signal source at point (40), due to the IF blocking capacitor of the bias-tee; instead it flows through the DC branch of the bias-tee, which has an impedance $Z_{IF}$ and, following Ohm's law ($V_{IF}=Z_{IF}*I_{IF}$), creates a voltage $V_{IF}$ at IF frequency. This secondary voltage then, depending on the baseband impedance ($Z_{IF}$), drives the amplifier and generates an up-converted secondary current $I_2$ at the output side of the DUT (FIG. 4), which interacts with and affects (increases or decreases, depending on the mutual phase of the current vectors) the original modulated signal $I_1$. This interaction, if not controlled properly, may deteriorate the amplifier's nonlinear performance. Controlling this secondary signal is possible through manipulating $Z_{IF}$. Thus the necessity to control and optimize the amplitude and phase of this secondary signal.

The impedances of RF (50), (51) and IF tuners (57), (58) in FIG. 5 are acquired by measuring scattering parameters (s-parameters) of each tuner between its input and output ports using a pre-calibrated vector network analyzer (VNA); s-parameters are measured for a number of tuner states (horizontal and vertical probe positions for the RF tuners (see ref. 1) and capacitor positions (see ref. 4) for the low frequency IF tuners; the measured s-parameters are saved in form of "calibration data files" on the hard-disk of the control computer, or other storage media, and are retrieved during load pull measurements, in order to configure the tuners in such a way as to reproduce the impedances contained in the calibration files. This then allows measuring and mapping the DUT's performance as a function of the tuner's impedances and search for an optimum RF and IF impedance combination.

Figure 1:
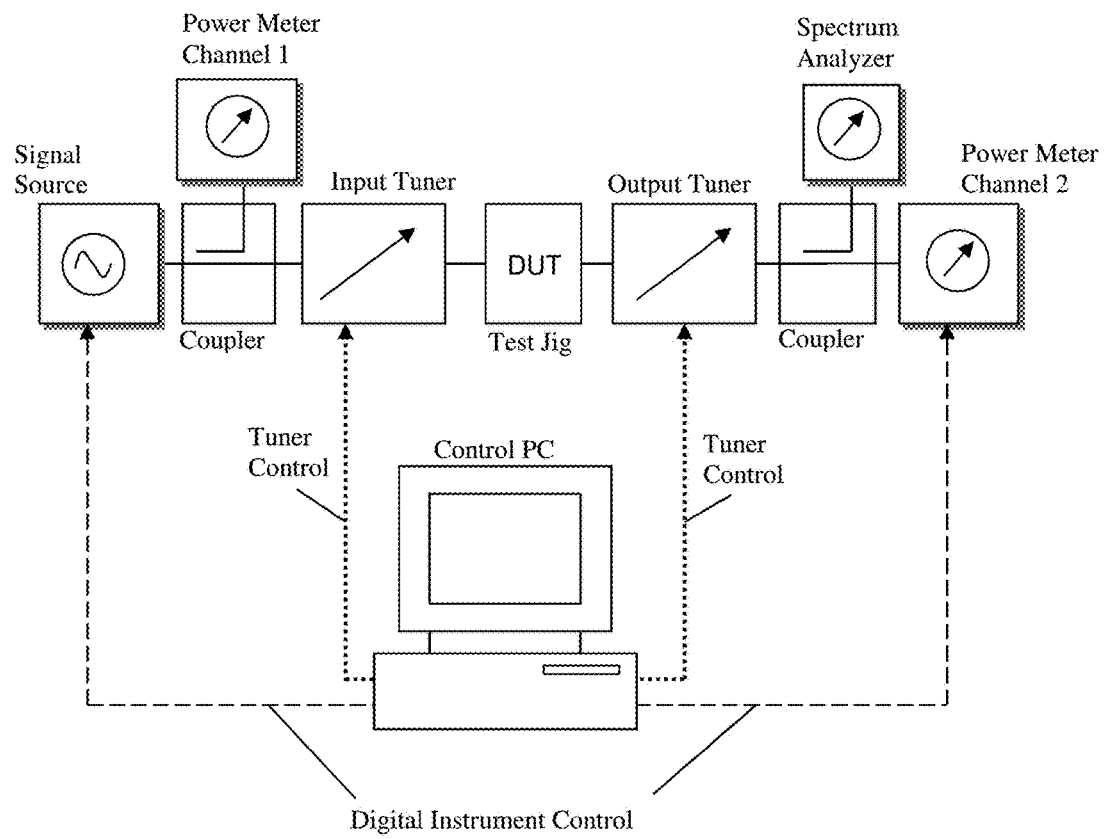
FIG. 1 depicts prior art, a typical automated load pull test setup.
Figure 6:
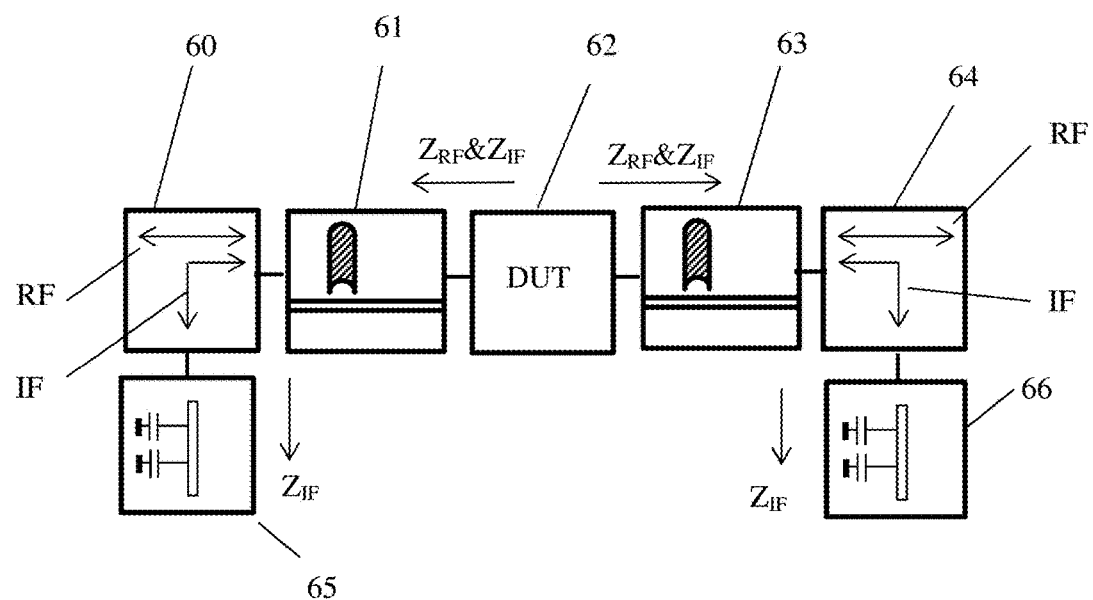
FIG. 6 depicts the block diagram of the test setup used in the test method the actual signal flow, RF and IF tuning devices and associated impedances seen by the DUT.
Figure 7:
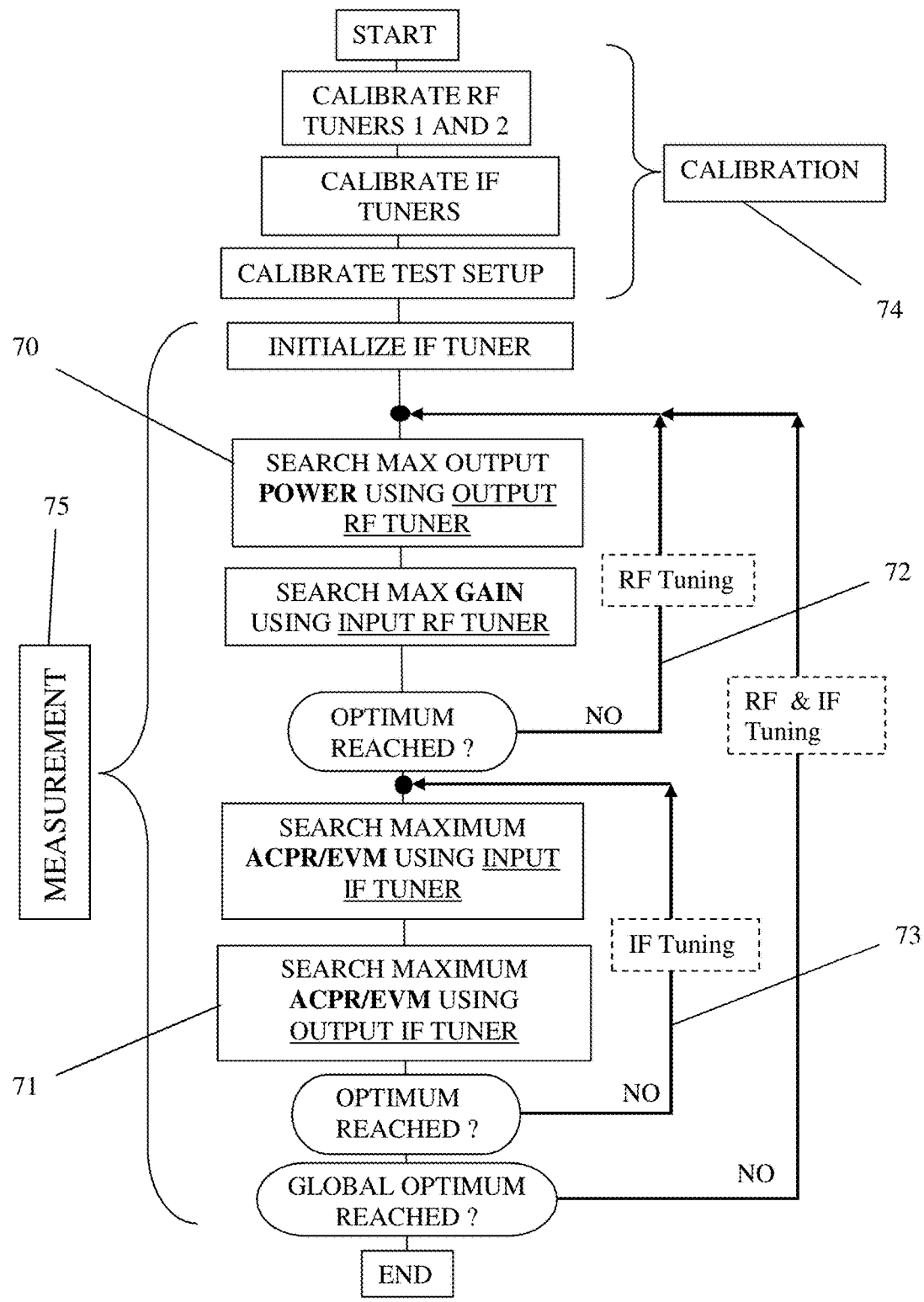
FIG. 7 depicts the flow-chart of the calibration and "intelligent" test procedure; it is noted that, other than in prior art, after calibration the test system is autonomous, no need for on-line impedance measurements.
Figure 8:
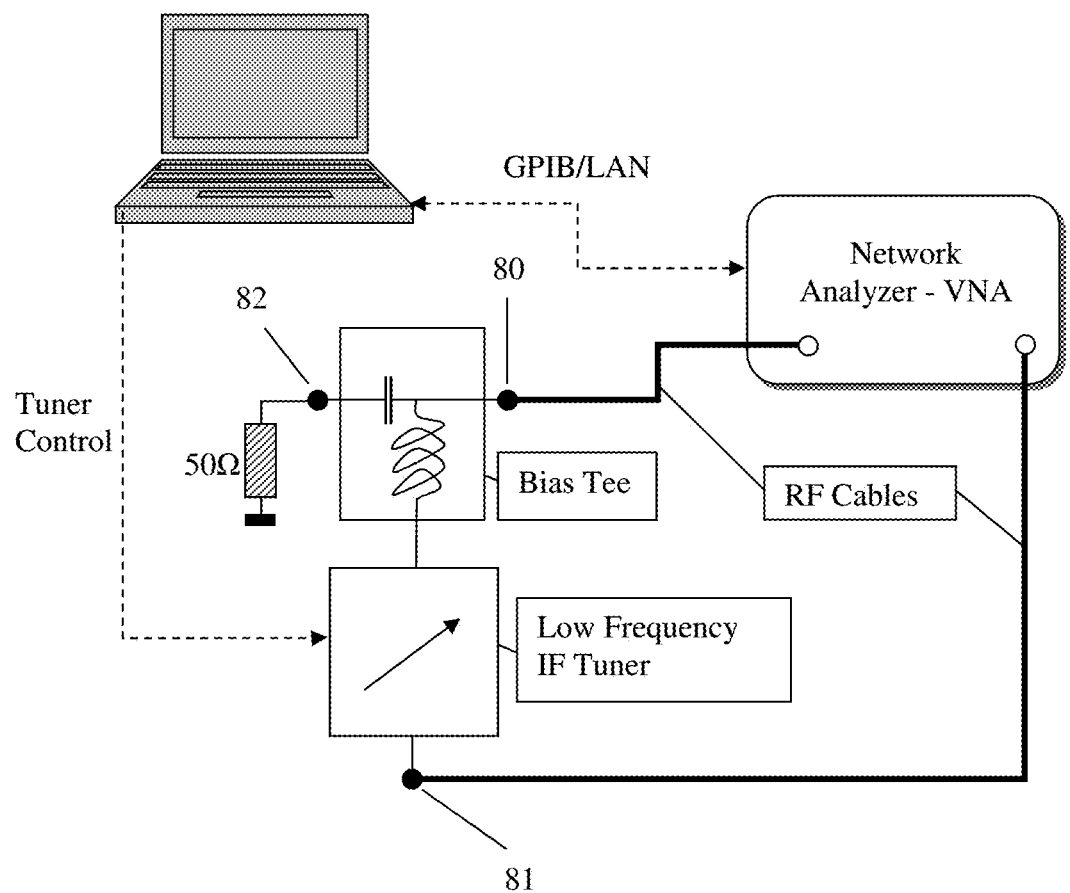
FIG. 8 depicts a calibration setup for low frequency (IF, baseband) tuner network which includes the Bias Tee network. RF tuners and components are calibrated by connecting RF cables directly to their input and output ports.

The measurement and the mapping procedure of impedance versus DUT behavior include two major steps (FIGS. 7 and 9): in a first major step the system is calibrated (74); this includes tuner and setup component calibration as shown in FIGS. 1, 5 and 8. The tuners are calibrated by connecting them individually to a pre-calibrated vector network analyzer (partly FIG. 8), which communicates with a control computer; RF tuner calibration is straight forward, the VNA cables are connected directly to the tuner ports and s-parameters are measured at RF and IF frequencies, for a multitude of tuner probe probes (slugs) and saved; this is part of prior art (see ref. 8). The IF tuner calibration is different, as shown in FIG. 8; the IF tuners being inserted in the DC bias path and not in-line with the main signal path must be calibrated with the DC bias-network included, between ports (80) and (81) while the RF port (82) is terminated with the characteristic impedance (Zo=50Ω). This way the measured s-parameters can be cascaded afterwards. FIG. 8 is self-explaining. The IF tuner's capacitors are placed at different settings and s-parameters are measured, both at IF and RF frequencies. Whereas for complete accuracy the s-parameters of both RF and IF tuners are measured at all selected frequencies (RF and IF) and because of the adopted configuration, the RF tuners (61),

(63) are transparent to IF frequencies and RF signals do not reach the IF tuners (65), (66) because of the bias tees (60), (64) acting as frequency band separators (Diplexers) (FIG. 6), the DUT (62) sees both RF and IF Impedances ($Z_{RF}$ and $Z_{IF}$) controlled simultaneously and largely independently. In both types of tuners the computer places remotely the tuning elements (reflective probes (slugs) in RF tuners and variable capacitors in IF tuners) to a multitude of positions, typically chosen in order to create a maximum coverage over the Smith chart (see ref. 1 and 3) and s-parameters of each tuner twoport are measured and saved in a calibration file. If harmonic RF tuners are used s-parameters are measured at all harmonic frequencies for all tuner probes and de-embedded (see ref. 9). Harmonic (multi-probe) RF tuners are "calibrated" (probes selected to cover the Smith chart) at the RF frequencies (Fo, 2 Fo, 3 Fo) but their s-parameters are also measured at the baseband frequency ($F_{IF}$), even though at IF frequencies the coverage is very limited, since the RF tuners behave, at IF frequencies, like simple low loss transmission lines.

The low frequency (IF) tuners are also calibrated at all RF and IF frequencies. Obviously (FIGS. 5 and 8) the effect of the IF tuners on the RF signal path is very small because of the blocking inductor (52). The IF tuners are calibrated similarly to the RF tuners, by setting the variable capacitors to various positions, selected to cover the Smith chart at the selected frequency, s-parameters are measured and saved in calibration files. It is important to notice that all calibration files, whether of the RF or the IF tuners comprise s-parameters at all RF and IF frequencies considered. In particular, as shown in FIG. 8, the IF tuners are calibrated using the remotely (GPIB or LAN) controlled VNA between ports (80) and (81) through the bias-tee with the RF port (82) terminated with Zo (50Ω). This is important because cascading s-parameters correctly is only possible if the ports of all networks are terminated using Zo. Once the calibrations are terminated the s-parameters of the components (test fixture, couplers, attenuators) of the setup are measured and all are cascaded numerically in computer memory and the overall calibration data files are saved.

In a second step and after assembling the test setup and after all s-parameters are cascaded in computer memory and saved in RF and IF tuner calibration files, the optimum impedance conditions are searched (70), (90). This can be done either using a "gradient" (FIG. 7) or a "brute-force" (FIG. 9) method.

In the case of the gradient method (FIG. 7) the tuners are set initially to some meaningful starting conditions (70), the RF tuners close to the conjugate complex input and output internal impedance of the DUT and the IF tuners are initialized, since the IF impedance behavior is not well (yet) understood, and this is one of the reasons why the proposed RF plus IF tuning method is important. Subsequently each tuner is steered to adjacent impedance states and the user-defined DUT characteristic (actual value) is measured and compared with a target (72). If the difference to the target objective decreases, the tuner is steered in the same direction with the amount of change proportional to the measured difference between actual value and target. If the difference increases, the search direction is changed, if possible perpendicularly, in terms of reflection factor in the polar (Smith) chart (71). This zig-zag routing search (73) proves easily implementable in RF slide screw tuners, because a horizontal probe (slug) movement affects the phase and a vertical probe movement affects the amplitude of the reflection factor vector. In the case of IF tuners the situation is slightly more complex, because these tuners do not offer an independent amplitude and phase control. In this case, each capacitor is modified alternatively seeking minimizing the error (difference to target). The search stops either when (a) the target, or (b) an optimum is reached, within the tuning range of each tuner. The DUT characteristics may depend on a combined impedance setting, in which case the search algorithm is repeated switching back to RF tuners, until no more improvement can be reached.

Figure 9:
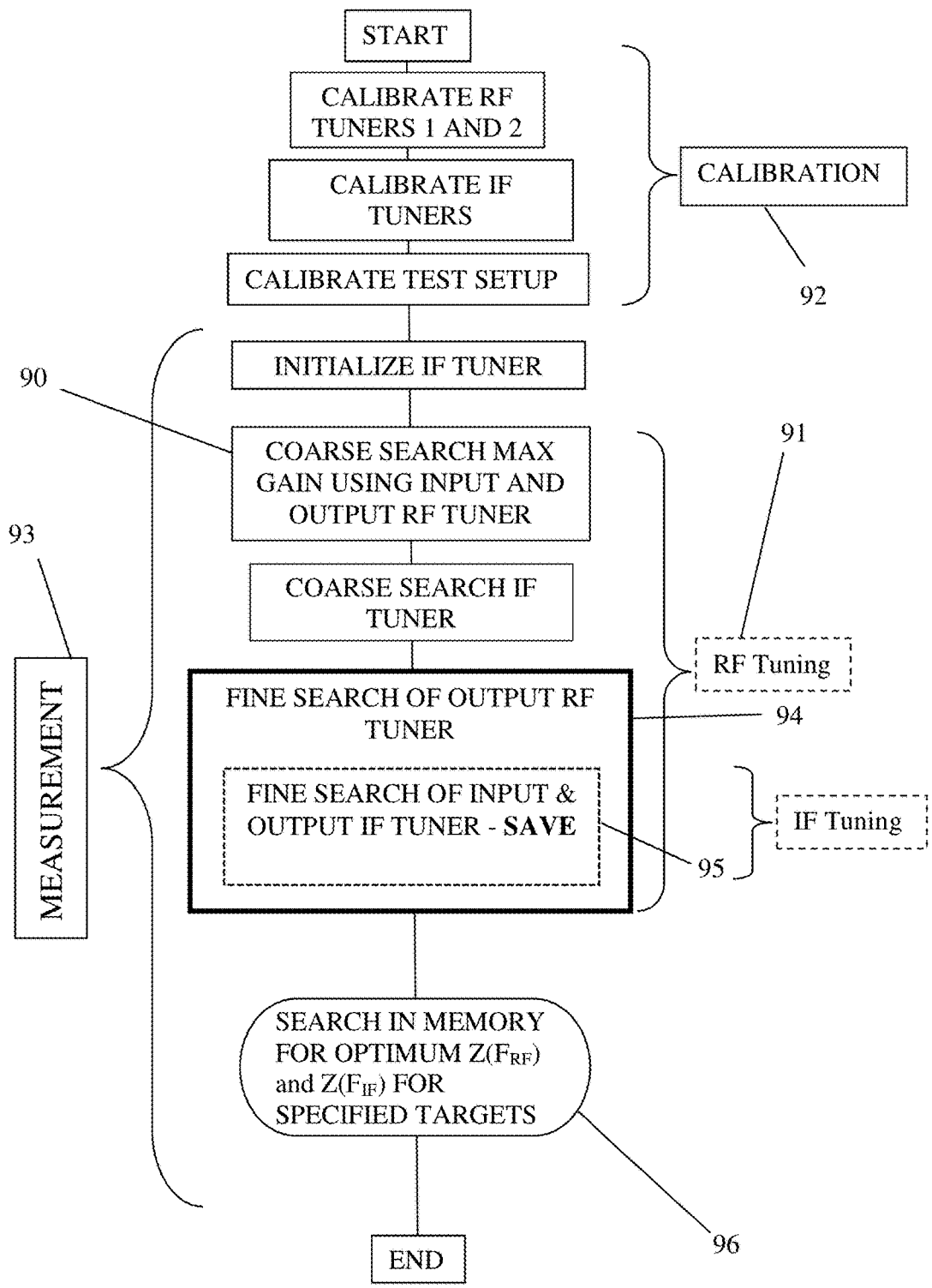
FIG. 9 depicts, the flow-chart of the calibration and "brute-force" test procedure; it is noted that, other than in prior art, after calibration the test system is autonomous, but calibrated points are scanned through and optimization occurs post testing through data processing.

The "brute-force" method shown is the flowchart of FIG. 9 can be described, step by step, as follows: a) calibrating the input and output RF tuners at RF and IF frequencies (92), by placing the tuning probes to a multitude of positions and saving data; b) calibrating at IF and RF frequencies the low frequency (IF) tuners including the bias networks (FIG. 8) at a multitude of capacitor settings and saving data; c) calibrating the components (test fixture, couplers, attenuators) of the setup (92); d) cascading with calibration data and saving in a global setup calibration file; this file contains all s-parameters of RF and IF tuners cascaded among themselves and with the passive setup components at all selected settings and all selected RF and IF frequencies.

After this the DUT is DC biased and the IF tuner(s) are initialized. Then all permutations of the RF input and output impedances are measured (93), scanned using a coarse grid of tuner states (90), (91); the result of this search yields approximate optimum impedance conditions to which the RF tuners are set; then scanning through the input IF tuner impedances using a coarse grid of tuner states; scan the IF impedance using the output IF tuner (if available) using a coarse grid for better performance of the DUT; selecting the optimum IF tuner state and set the tuner to it; as a last RF operation scan the RF impedances using a fine grid of input and output tuner states (94) around the optimum value in search for better performance and set the RF tuners to the new states found; then scan the IF impedance of the input IF tuner using a fine grid (95) around the state found before; set the IF tuner to the new state; and finally using a fine grid of the output IF tuner (if available) and set the output IF tuner. Search through computer memory (96) the saved data for optimum or specified conditions (impedances versus DUT characteristics).

In summary, the "brute force" alternative consists of systematically scanning all possible permutations of impedances at RF and IF frequencies, first using a coarse tuner state grid for both RF and IF tuners, setting the tuners to the best states found in the coarse search, and continue using a fine search around the previously set states, scanning all available tuner state permutations in the fine grid, while measuring the DUT performance. Then saving all data and selecting solutions for the quantity to optimize (Gain, Power, ACPR (see ref. 10), EVM (see ref. 11), Intermod (IMD, see ref. 12), etc.) or combinations thereof, numerically by searching through the full data base. This method is possible, safe, but time consuming. It is easy to estimate that a coarse grid of 17 points per tuner (3 reflection factor levels every 45 degrees) would require testing around $17^2=289$ points (17 for input and 17 for output tuner) and an additional 10 point fine grid around the optimum another 100 points. If RF harmonic impedances are added the numbers increase dramatically, by increasing the numbers to the second power (2 harmonics) or the third power (3 harmonics). The same rules and numbers approximately apply for the IF tuners, albeit harmonic IF tuners could theoretically also be used, if available.

Although the present invention has been explained hereinabove by way of a preferred embodiment thereof, it should be pointed out that other combinations of the described

What I claim is:

1. A method for testing a nonlinear behavior of microwave components (DUT) in which a RF (radio frequency) signal at a carrier high frequency FRF, modulated with a modulation low frequency (FIF), is injected,
   whereby the DUT nonlinear behavior is tested simultaneously and independently as a function of a RF impedance Z(FRF) and a low frequency (IF) impedance Z(FIF) presented at an input and output ports of the DUT using calibrated RF and IF tuners,
   whereby input and output RF tuners are inserted in a signal path between a signal source, the DUT and a load correspondingly and,
   whereby the input and output IF tuners are inserted in a direct current (DC) path of bias networks;
   said bias networks (bias-tees) being inserted between the signal source and input RF tuner and between output RF tuner and load;
   said method comprises two approaches:
   a) a first, "gradient" approach, in which the Z(FRF) and Z(FIF) are modified following a gradient search algorithm while DUT parameters are measured in search of optimum conditions;
   b) a second, "brute force" approach, in which the impedances of RF and IF tuners are synthesized, first using a coarse and then a fine tuning grid, the DUT parameters are measured and saved in data base and optimum impedances are determined through post-processing numeric search in the data base.

2. The method of claim 1,
   whereby the output IF tuner is omitted.

3. The method of claim 1,
   whereby at least the output RF tuner is multi-carriage-multi-probe (harmonic) tuner.

4. The method of claim 1, whereby the RF impedances at the fundamental and harmonic frequencies and the IF impedances, are controlled independently and the RF performance of the DUT is measured using associated measurement instruments.

5. The method of claim 1, wherein the gradient approach further comprising a calibration and a measurement routine, whereby
   a) the calibration routine comprises the following steps:
   i) calibrating at RF and IF frequencies input and output RF tuners by placing tuning probes to a multitude of positions and saving data;
   ii) calibrating at IF and RF frequencies the low frequency tuners, including the bias-tees, at a multitude of capacitor settings and saving data;
   iii) calibrating passive components of the setup and saving data;
   iv) cascading calibration data of steps i) to iii) and saving;
   b) the measurement routine comprises the following steps:
   i) DC biasing the DUT and initializing low frequency tuner(s);
   ii) selecting a DUT characteristic to test and optimize;
   iii) applying gradient search for optimum load impedance for maximum power using output RF tuner at the fundamental carrier frequency (Fo);
   iv) applying gradient search for optimum source impedance for maximum gain using input RF tuner at a fundamental carrier frequency (Fo);
   v) repeating steps iii) and iv) until no further improvement occurs;
   vi) leaving input and output RF tuners at optimum states and applying gradient search for optimum ACPR or EVM using input IF tuner;
   vii) applying gradient search as in step vi) using output IF tuner (if available);
   viii) repeat steps vi) and vii) until no further improvement occurs;
   ix) save RF and IF impedances, Power, Gain, ACPR, IMD or EVM data and quit.

6. The method of claim 1, wherein the brute force approach further comprising a calibration and a measurement routine, whereby
   a) the calibration routine comprises the following steps:
   i) calibrate at RF and IF frequencies input and output RF tuners by placing tuning probes to a multitude of positions and saving data;
   ii) calibrate at IF and RF frequencies the low frequency tuners, including the bias-tees, at a multitude of capacitor settings and saving data;
   iii) calibrate passive components of the setup and saving data;
   iv) cascade calibration data of steps i) to iii) and save;
   b) the measurement routine comprises the following steps:
   i) DC bias the DUT and initialize low frequency tuner(s);
   ii) select the DUT characteristic to test and optimize;
   iii) apply gradient search for optimum source and load impedance for maximum gain using input and output RF tuner at the carrier frequency (FRF=Fo);
   iv) tune to a coarse impedance grid around the optimum found in step iii) and measure and save all selected RF parameters of the DUT;
   v) settle for the optimum found in step iv);
   vi) tune to a fine impedance grid around the optimum found in step v) and measure and save all selected RF parameters of the DUT;
   vii) settle for the optimum found in step vi);
   viii) keep RF tuners as in step vii);
   ix) execute steps iv) to vii) for modulation IF frequency (FIF) using low frequency tuners;
   x) search for and extract from saved data the optimum RF and IF impedances;
   xi) save RF and IF impedances, Power, Gain, ACPR, IMD or EVM data and quit.

* * * * *